US011105257B2

(12) United States Patent
Louco et al.

(10) Patent No.: US 11,105,257 B2
(45) Date of Patent: Aug. 31, 2021

(54) LIQUID-COOLED POWER ELECTRONICS ASSEMBLY FOR ELECTRICALLY-ACTUATED TURBOCHARGERS

(71) Applicant: BorgWarner Inc., Auburn Hills, MI (US)

(72) Inventors: Lathom Alexander Louco, Arden, NC (US); Jeffrey Carter, West Yorkshire (GB); Brian Handlon, Arden, NC (US)

(73) Assignee: BORGWARNER INC., Auburn Hills, MI (US)

( * ) Notice: Subject to any disclaimer, the term of this patent is extended or adjusted under 35 U.S.C. 154(b) by 0 days.

(21) Appl. No.: 17/021,253

(22) Filed: Sep. 15, 2020

(65) Prior Publication Data

US 2021/0087967 A1 Mar. 25, 2021

Related U.S. Application Data

(60) Provisional application No. 62/904,284, filed on Sep. 23, 2019.

(51) Int. Cl.
| | |
|---|---|
| *F02B 37/12* | (2006.01) |
| *H05K 7/14* | (2006.01) |
| *F02D 41/00* | (2006.01) |
| *F02B 39/00* | (2006.01) |
| *H05K 1/02* | (2006.01) |

(52) U.S. Cl.
CPC ............ *F02B 37/12* (2013.01); *F02B 39/005* (2013.01); *F02D 41/0007* (2013.01); *H05K 1/02* (2013.01); *H05K 7/1432* (2013.01)

(58) Field of Classification Search
CPC ..... F02B 37/12; F02B 39/005; H05K 7/1432; H05K 1/02; F02D 41/0007
See application file for complete search history.

(56) References Cited

U.S. PATENT DOCUMENTS

| 5,684,380 A | 11/1997 | Woody et al. |
|---|---|---|
| 6,450,275 B1 | 9/2002 | Gabriel et al. |
| 7,307,841 B2 | 12/2007 | Berlin et al. |
| 7,414,845 B2 | 8/2008 | Attlesey et al. |

(Continued)

FOREIGN PATENT DOCUMENTS

| EP | 2305981 A1 | 4/2011 |
|---|---|---|
| KR | 101404278 B1 | 6/2014 |

(Continued)

*Primary Examiner* — Audrey K Bradley
*Assistant Examiner* — Edward Bushard
(74) *Attorney, Agent, or Firm* — Reising Ethington P.C.

(57) ABSTRACT

A power electronics assembly that controls an electrically-actuated turbocharger includes a printed circuit board (PCB) having a non-conductive substrate supporting one or more electrical components that attach to the non-conductive substrate on one or more sides of the PCB; one or more conductive layers that couple with the non-conductive substrate and conduct electrical current within the PCB; a fluid barrier layer applied to an outer surface of the non-conductive substrate or conductor layer; and a PCB housing, configured to couple with the electrically-actuated turbocharger, having a fluid cavity that communicates liquid from an internal combustion engine (ICE) to the fluid barrier layer separating the liquid and the PCB.

15 Claims, 4 Drawing Sheets

(56) References Cited

U.S. PATENT DOCUMENTS

| | | |
|---|---|---|
| 7,724,517 B2 | 5/2010 | Attlesey et al. |
| 8,014,150 B2 | 9/2011 | Campbell et al. |
| 9,546,589 B2 | 1/2017 | Young et al. |
| 9,551,349 B2 | 1/2017 | Tecza et al. |
| 9,810,129 B2 | 11/2017 | Zhou et al. |
| 2004/0190255 A1 | 9/2004 | Cheon |
| 2007/0034360 A1* | 2/2007 | Hall |
| 2013/0294928 A1* | 11/2013 | Rosinski ............ F04D 15/0066 417/5 |
| 2016/0241110 A1 | 8/2016 | Maguire et al. |
| 2018/0045108 A1 | 2/2018 | Baeuerle et al. |

FOREIGN PATENT DOCUMENTS

| | | |
|---|---|---|
| WO | WO2010009945 A2 | 1/2010 |
| WO | WO2012138545 A2 | 10/2012 |

* cited by examiner

LIQUID-COOLED POWER ELECTRONICS ASSEMBLY FOR ELECTRICALLY-ACTUATED TURBOCHARGERS

CROSS-REFERENCE TO RELATED APPLICATIONS

This application claims the benefit of U.S. Patent Application No. 62/904,284 filed on Sep. 23, 2019, the disclosure of which is herein incorporated by reference in its entirety.

TECHNICAL FIELD

The present application relates to electrically-actuated turbochargers and, more particularly, to power electronics that control electrically-actuated turbochargers.

BACKGROUND

Internal combustion engines (ICEs) combine fuel, spark, and an intake of ambient air to create a combustion event that repeatedly moves pistons in a way to forcibly rotate a crankshaft. Fuel and spark are introduced into a combustion chamber at one end of a cylinder within which the piston moves reciprocatively. As fuel and spark are delivered to the combustion chamber in the presence of ambient air, combustion occurs and forces the piston away from the combustion chamber thereby converting that force into rotational energy through the crankshaft. The power of an ICE can be increased for a given quantity of fuel and spark using the forced induction of ambient air into the combustion chambers via turbochargers. In the past, turbochargers included a compressor and an exhaust turbine that were mechanically linked via a common shaft. Turbochargers receive exhaust gas generated by the ICE and the flow of that gas rotates the exhaust turbine as well as the compressor compressing air ultimately introduced to the intake of the ICE.

Turbochargers successfully compress air that is introduced to the intake of the ICE using the flow of exhaust gas. But modern ICEs increasingly use electrically-actuated turbochargers for forced induction. Electrically-actuated turbochargers use an electric motor to turn a compressor that can be solely powered by the electric motor or by both the electric motor and an exhaust turbine. Power electronics are used to control the electric motor used with electrically-actuated turbocharger.

However, the inclusion of an electric motor with a turbocharger involves additional challenges that may not exist for non-electrically-actuated turbochargers. For example, the electric motors can be controlled by electrical components that are sensitive to heat. Yet turbochargers often operate in a high-heat environment. Moving the electrical components away from the turbocharger and connecting them to the electrical motor can help keep them cool but this increases cost and complexity. Keeping the electrical components simultaneously cool and nearby the turbocharger can be challenging.

SUMMARY

In one implementation, an electronics assembly that controls an electrically-actuated turbocharger includes a printed circuit board (PCB) having a non-conductive substrate supporting one or more electrical components that attach to the non-conductive substrate on one or more sides of the PCB; one or more conductive layers that couple with the non-conductive substrate and conduct electrical current within the PCB; a fluid barrier layer applied to an outer surface of the non-conductive substrate or conductor layer; and a PCB housing, configured to couple with the electrically-actuated turbocharger, having a fluid cavity that communicates liquid from an internal combustion engine (ICE) to the fluid barrier layer separating the liquid and the PCB.

In another implementation, an electronics assembly that controls an electrically-actuated turbocharger includes a PCB having a non-conductive substrate supporting one or more electrical components that attach to the non-conductive substrate on one side of the PCB; one or more conductive layers that couple with the non-conductive substrate and conduct electrical current within the PCB; a first fluid barrier layer applied to an outer surface of the non-conductive substrate; a second fluid barrier layer applied to an outer surface of the conductive layer; a PCB housing, configured to couple with the electrically-actuated turbocharger, having a first fluid cavity partially defined by the first fluid barrier layer and a second fluid cavity partially defined by the second fluid barrier layer, that communicates liquid from an ICE over the first fluid barrier layer and the second fluid barrier layer separating the liquid and the PCB.

DETAILED DESCRIPTION

An electrically-actuated turbocharger can use electrical components mounted on a printed circuit board (PCB) that is coated on one side with a fluid barrier layer, which is exposed to cooling fluid provided by an internal combustion engine (ICE). The PCB can include a bottom conductive layer on which is applied a fluid barrier layer that is thermally-conductive yet electrically insulating. The barrier layer is then directly exposed to a flow of cooling fluid, such as engine coolant or engine oil, that reduces the temperature of the PCB and the electrical components. Without an active cooling system, the PCB can reach temperatures of 175 degrees Celsius (C.). In contrast, engine coolant or engine oil normally exists at approximately 100 degrees C. and the flow of such fluid over the fluid barrier layer can reduce the temperature at which the PCB operates. Reducing the temperature of the PCB can increase the efficiency of the electrical components carried by the PCB, reduce the rated power requirements of the electrical components, or both. Previous implementations of PCBs that carry electrical components for electrically-actuated turbochargers have been cooled differently. For example, the PCBs have been sealed inside a housing and coolant can flow past and contact an external surface of the housing. However, in these past designs, an air gap exists between the PCB and the housing, and the flow of engine oil or engine coolant against the outer surface of the housing is less efficient than directly cooling the PCB through a fluid barrier layer. In another implementation, the barrier layer can overcoat electrical components on a top surface of the PCB and the layer can be exposed to the engine oil/coolant flow. An example of this barrier layer is an thermally-conductive silicone elastomer sold under the brand name Thremosink™. In another implementation, the barrier layer could be implemented as a thermally-conductive filled epoxy or silicone. The filled epoxy or silicone can be filled with Alumina, Boron Nitride, or Diamond, to name a few examples. One implementation of a thermally-conductive filled epoxy is made by Cova Scientific.

Figure 1:
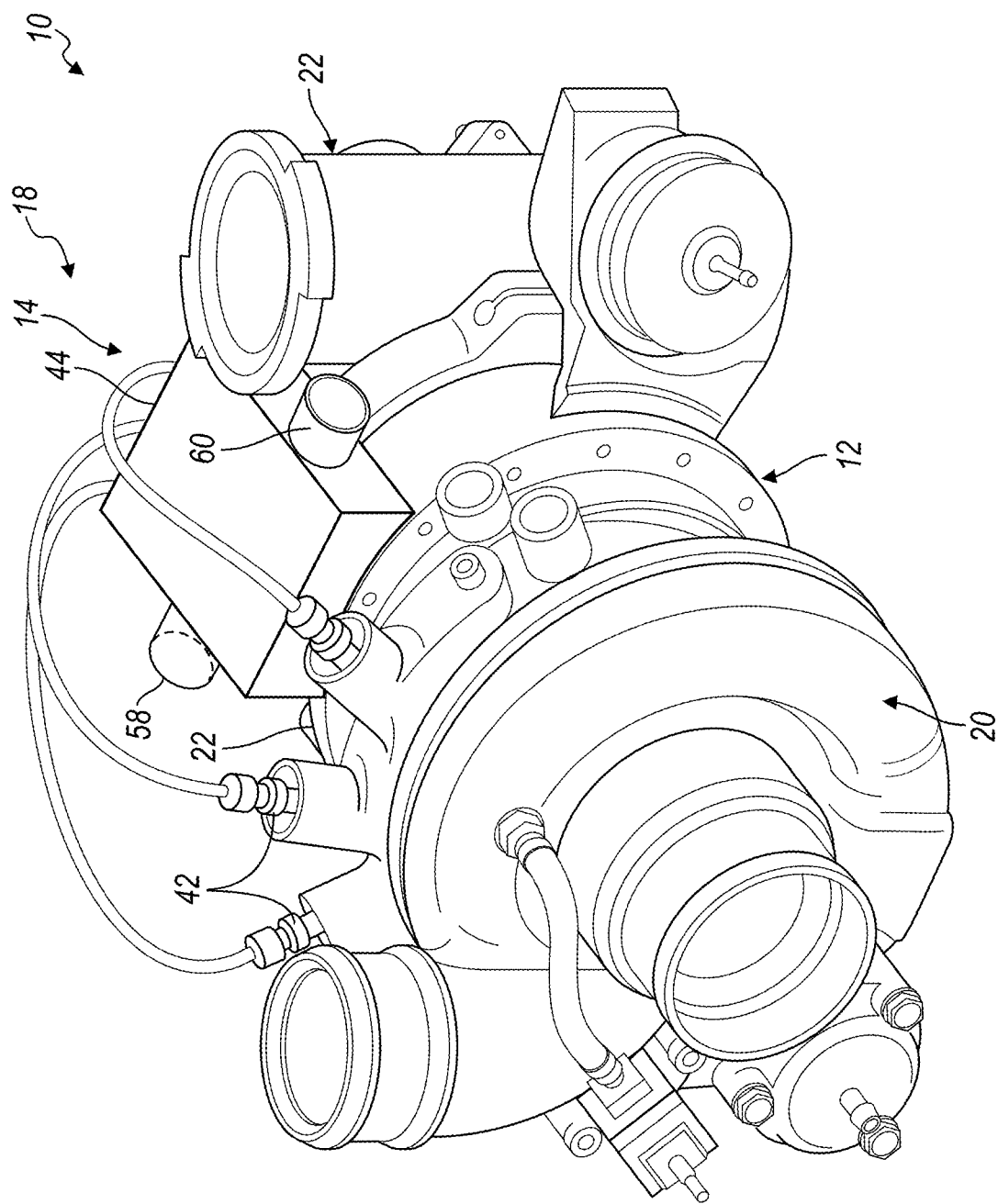
FIG. 1 is a perspective view depicting an implementation of an electrically-actuated turbocharger assembly.
Figure 2:
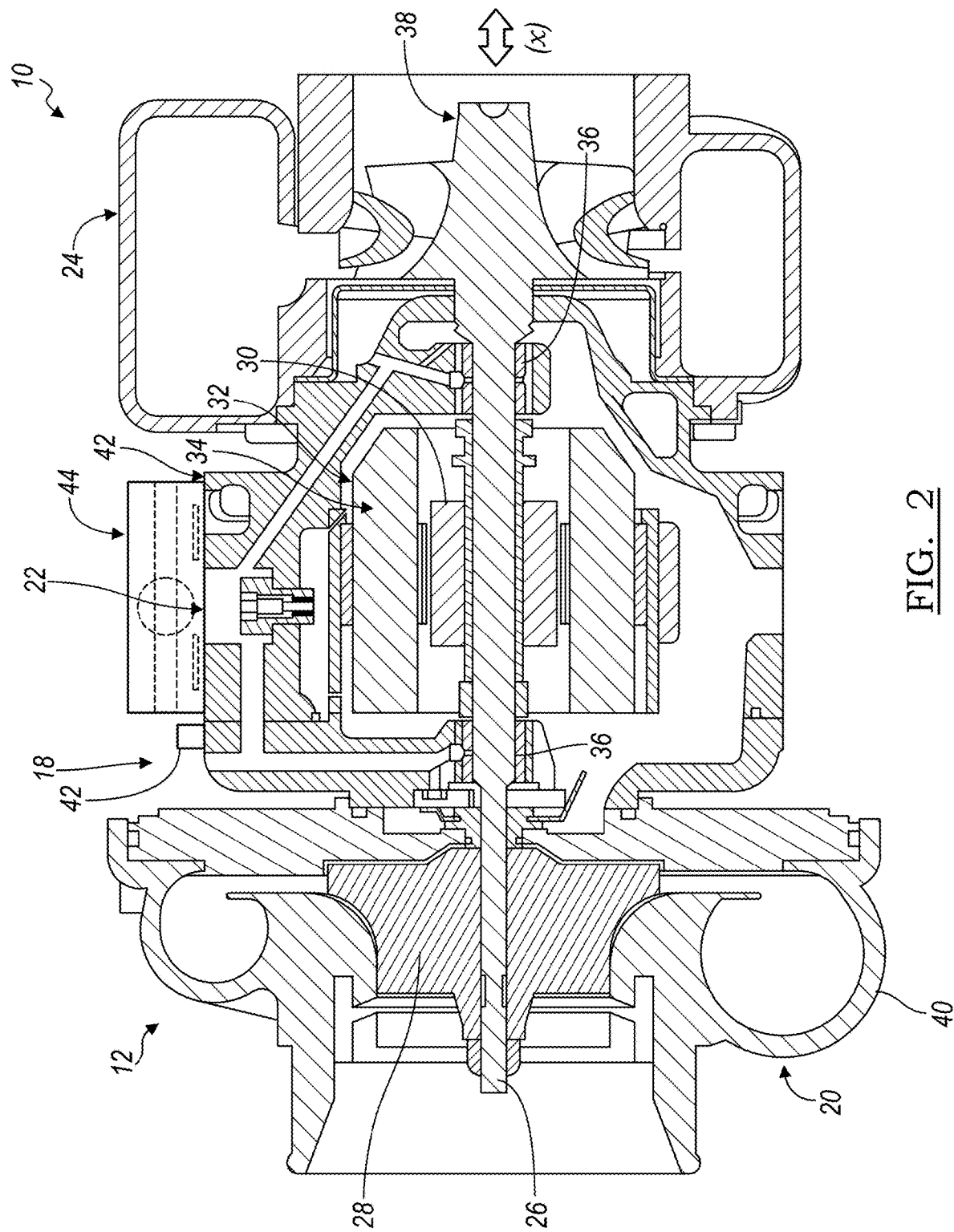
FIG. 2 is a cross-sectional view depicting an implementation of an electrically-actuated turbocharger.

FIGS. 1-2 depict one implementation of an electrically-actuated turbocharger assembly 10 that includes an electrically-actuated turbocharger 12 and an electronics assembly 14 that includes a PCB 16 carried by a turbocharger housing 18. The electrically-actuated turbocharger 12 includes a compressor portion 20, an electric motor portion 22, and an exhaust portion 24 that are assembled to form a structure that receives the components of the turbocharger 12. A turbine shaft 26 extends through the compressor portion 20, the electric motor portion 22, and the exhaust portion 24 as can be appreciated in FIG. 2. At one end, the turbine shaft 26 couples with a compressor 28, located in the compressor portion 20, that spins to compress air, which is ultimately supplied to an intake plenum (not shown) of an internal combustion engine (ICE). Another portion of the turbine shaft 26 that is axially-spaced from the compressor 28 and located in the electric motor portion 22 couples with a rotor assembly 30 of an electric motor 32. The rotor assembly 30 can be positioned concentrically relative to a stator 34 included in the electric motor portion 22. One or more bearings 36 are included in the electric motor portion 22 and axially spaced along the turbine shaft 26 to support and stabilize the turbine shaft 26, the compressor 28, the rotor assembly 30, and an exhaust turbine 38 as these elements rotate within the turbocharger 12 during operation. The exhaust turbine 38 is coupled to an end of the turbine shaft 26 distal to the compressor 28 located in the exhaust portion 24.

The compressor portion 20 includes a compressor chamber 40 in which the compressor 28 spins in response to the rotation of the turbine shaft 26 and compresses air that is ultimately supplied to the intake manifold of the ICE. The compressor 28 is coupled with the turbine shaft 26 that extends from the compressor portion 20 into the electric motor portion 22 and the exhaust portion 24. The rotor assembly 30 is coupled to the turbine shaft 26 so that the rotor assembly 30 and the turbine shaft 26 are not angularly displaced relative to each other. When combined, the rotor assembly 30 extends axially relative to the shaft 24 in close proximity to the stator 34. The stator 34 can include a plurality of windings that convey electrical current from the power electronics and induce the angular displacement of the rotor assembly 30 and the turbine shaft 26 coupled to the rotor assembly 30 relative to the stator 34. The compressor chamber 40 is in fluid communication with a compressor inlet that draws air from the surrounding atmosphere and supplies it to the compressor 26. As the PCB selectively provides current to the windings of the stator 34, the rotor 30 is induced to rotate and impart that rotation on the turbine shaft 26 and the compressor 28.

In one implementation, the stator 34 and the rotor 30 can be implemented as a direct current (DC) brushless motor that receives DC voltage from a vehicle battery (not shown). The amount of DC voltage applied to the stator 34 may be greater than 40 volts (V), such as can be provided by a modern 48V vehicle electrical system. Other implementations are possible in which a vehicle electrical system uses higher voltages, such as 400V and 800V. Electrical connectors 42 are included on the electrically actuated turbocharger 12 and communicate electrical power from an electrical source to the turbocharger 12 through the PCB 16 that regulates electrical current supplied to the electrical motor of the electrically-actuated turbocharger 12. A power cable 43 electrically connects the vehicle battery to the PCB 16 and the electrical connectors 42 electrically connect the PCB 16 to the electrically-actuated turbocharger 12.

The exhaust portion 24 is in fluid communication with exhaust gases generated by the ICE. As the revolutions per minute (RPMs) of the crankshaft of the ICE increase, the volume of the exhaust gas generated by the ICE increases and correspondingly increases the pressure of exhaust gas in the exhaust portion 24. This increase in pressure can also increase the angular velocity of the exhaust turbine 38 that communicates rotational motion to the compressor 28 through the turbine shaft 26. In this implementation, the compressor 28 receives rotational force from the exhaust turbine 38 and the electric motor 32. More particularly, when the ICE is operating at a lower RPM, the electric motor 32 can provide rotational force to the compressor 28 even though exhaust gas pressure within the exhaust portion 24 is relatively low. As the ICE increases the RPM of the crankshaft, exhaust gas pressure within the exhaust portion 24 can build and provide the rotational force that drives the compressor 28.

The electronics assembly 14 is coupled to the electrically-actuated turbocharger 12 as is shown in FIGS. 1-2. The electronics assembly 14 includes the PCB housing 44 and the PCB 16. The PCB housing 44 is shaped so that it fits closely with or abuts the electrically-actuated turbocharger 12. It should be appreciated that the concepts described herein can be applied to electrically actuated turbochargers configured in different ways. For example, the electrically actuated turbocharger can be implemented using a compressor portion and an electric motor portion while omitting the exhaust portion. In such an implementation, the turbocharger includes a compressor coupled to the electric motor via a turbine shaft without relying on an exhaust turbine to also be coupled to the turbine shaft. This implementation can sometimes be referred to as an electric supercharger because forced induction in this implementation relies solely on the rotational force provided by an electric motor rather than also using an exhaust turbine that is rotationally driven by exhaust gases.

Figure 3:
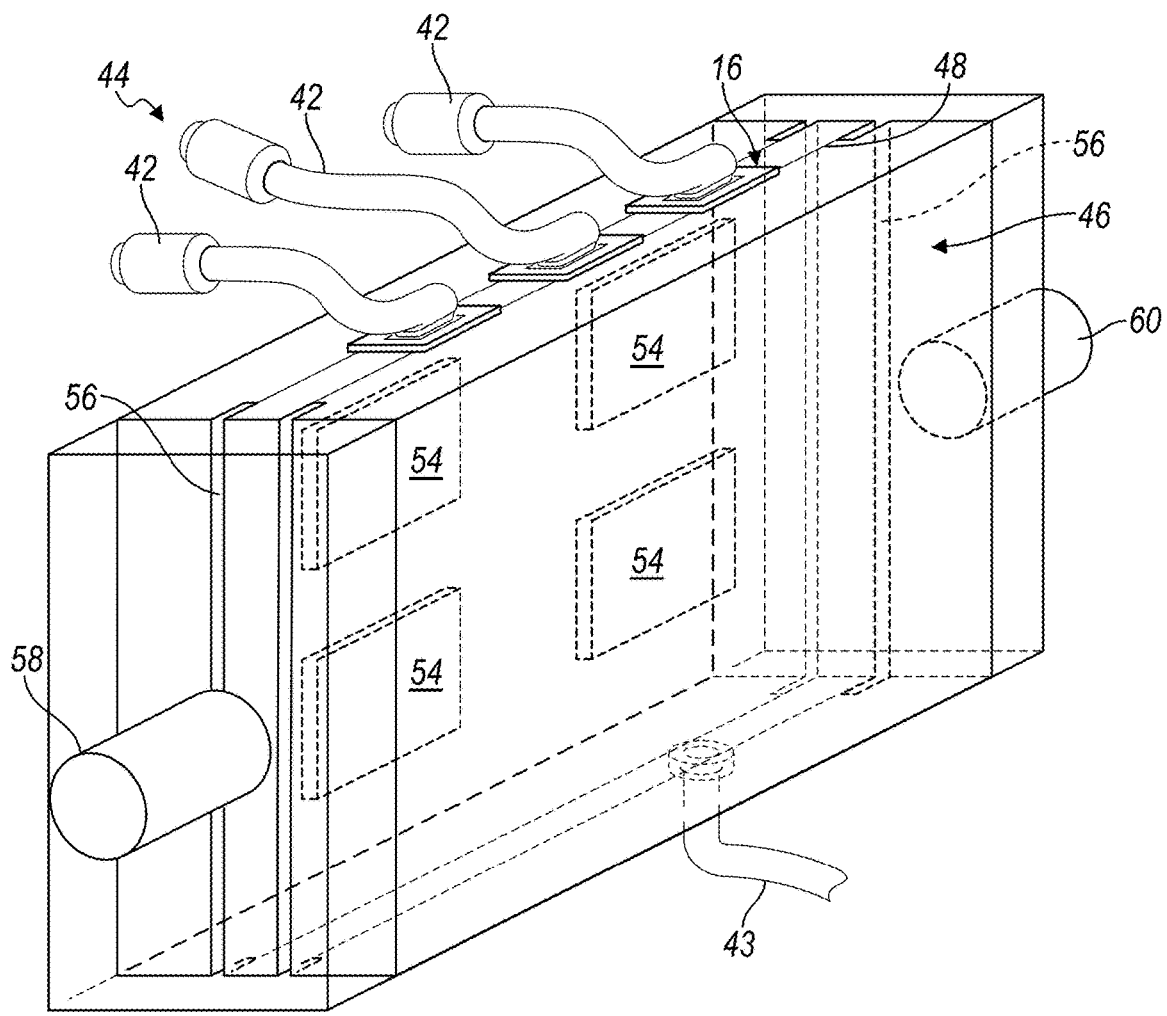
FIG. 3 is a perspective view depicting an implementation of a portion of an electrically-actuated turbocharger assembly.
Figure 4:
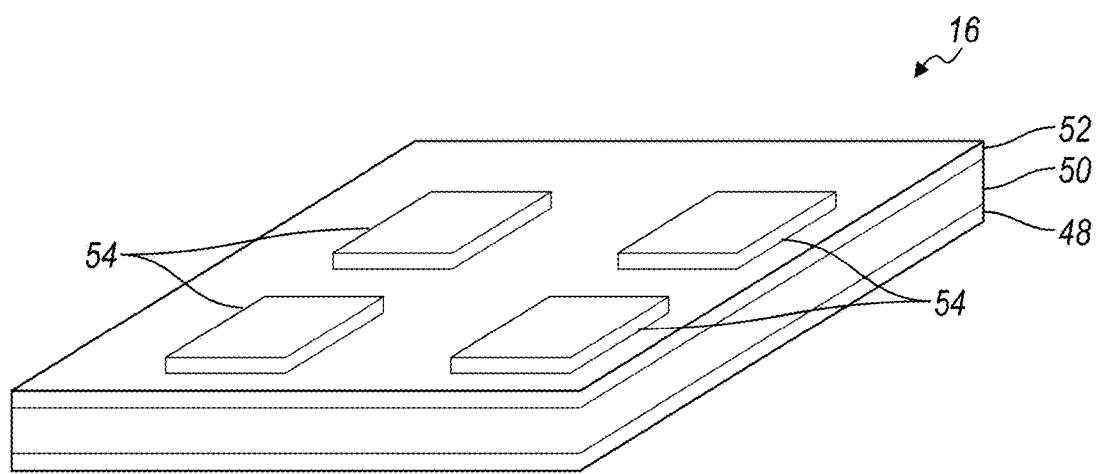
FIG. 4 is a perspective view depicting an implementation of a printed circuit board (PCB) used with the electrically-actuated turbocharger.

A PCB housing 44 including the PCB 16 is coupled with the assembly 10. FIG. 3 shows the PCB housing 44 in more detail. The PCB housing 44 includes a fluid cavity 46 that is at least partially defined by a surface of the PCB 16. The PCB 16 include at least one exposed surface onto which a fluid barrier layer 48 is applied and exists between the PCB 16 and the fluids flowing through the fluid cavity 46. The PCB 16 shown can include the fluid barrier layer 48, a conductive layer 50, a substrate layer 52, a solder mask (not shown), and a silk screen (not shown). FIG. 4 depicts the PCB 16 in more detail. The substrate layer 52 can support a plurality of electrical components 54 that form the electrical circuitry used to control and selectively supply power to the electrically-actuated turbocharger 12. The substrate layer 52 can be constructed from a non-conductive material, such as glass-reinforced epoxy laminate that is commonly referred to as FR4. The electrical components 54 may be capacitors, resistors, and/or switches that are physically mounted on the substrate layer 52 and include electrical leads that pass through the layer 52 to electrically connect with the conductive layer 50. Or, alternatively, the substrate layer 52 can support one or more vias (not shown) that extend through the substrate layer 52 to electrically connect with the conductive layer 50. The electrical leads of the electrical components 54 can be electrically connected, such as by soldering, to the vias that ultimately communicate electrical current to the conductive layer 50. The conductive layer 50 can include one or more circuit traces that electrically connect a plurality of the electrical components 54 carried by the substrate layer 52. In this implementation, the conductive layer 50 comprises bonded copper but other conductive materials could be used instead.

The conductive layer 50 can be coated with the fluid barrier layer 48. However, it should be appreciated that a PCB having the fluid barrier layer can be differently configured having a particular quantity of layers different than what is shown. The quantity of layers can be chosen based on one or more factors, such as the identity and quantity of the electrical components selected to implement the circuitry used to control and power the electrically-actuated turbocharger. The fluid barrier layer 48 can be applied to an outer surface of the PCB 16—in this implementation the conductive layer 50—so that the layer 48 exists in between the fluid supplied by the ICE and the PCB 16 such that the surface of the PCB 16 at least partially forms a portion of the fluid cavity 46. In one implementation, the fluid barrier layer 48 comprises a thermally-conductive silicone elastomer. As noted above, an implementation of this product is commercially sold under the name Thermosink™. Other relatively thin materials can be used for the fluid barrier layer 48 that withstand the effects of the fluid and temperature at which the fluid exists. For example, the fluid barrier layer 48 could be implemented as a thermally-conductive filled epoxy or silicon. Gap fillers exist that can be used to implement the fluid barrier layer 48, such as Bergquiest Gap Filler TGF 4000. The surface of the conductive layer 50 can be coated with the acrylated polyurethane or the thermally-conductive filled epoxy or silicon, for instance, to form the fluid barrier layer 48. Once formed, the PCB 16 can be inserted into slots 56 formed in the PCB housing 44 that have a thickness closely matched to the thickness of the PCB 16 so as to rigidly hold the PCB 16 relative to the PCB housing 44 and form a fluid-tight seal between the PCB 16 and the PCB housing 44. A sealing feature, such as a gasket or chemical sealant, can be applied where the fluid barrier layer 48 at the edges of the PCB 16 contact the slots 56 to prevent the fluid from leaking out of the fluid cavity 46 and into other parts of the PCB housing 44.

The fluid cavity 46 can be in fluid communication with an inlet port 58 and an outlet port 60. Fluid from the ICE, such as engine oil or engine coolant, can be supplied to the inlet port 58 under pressure generated by an oil pump or water pump. The fluid from the ICE can arrive from an engine oil cooler or radiator that lowers the temperature of the fluid. In one example, the fluid can exist at 100° Celsius (C.) while the housing 18 of the electrically-actuated turbocharger may exist at 175° C. so the fluid can lower the temperature level of the PCB housing 44. As the fluid contacts and flows against the fluid barrier layer 48, exiting the fluid cavity 46 through the outlet port 60, the flow of fluid through the fluid cavity 46 against the fluid barrier layer 48 can remove heat from the PCB housing 44 and the temperature of the PCB 16 can be reduced.

Figure 5:
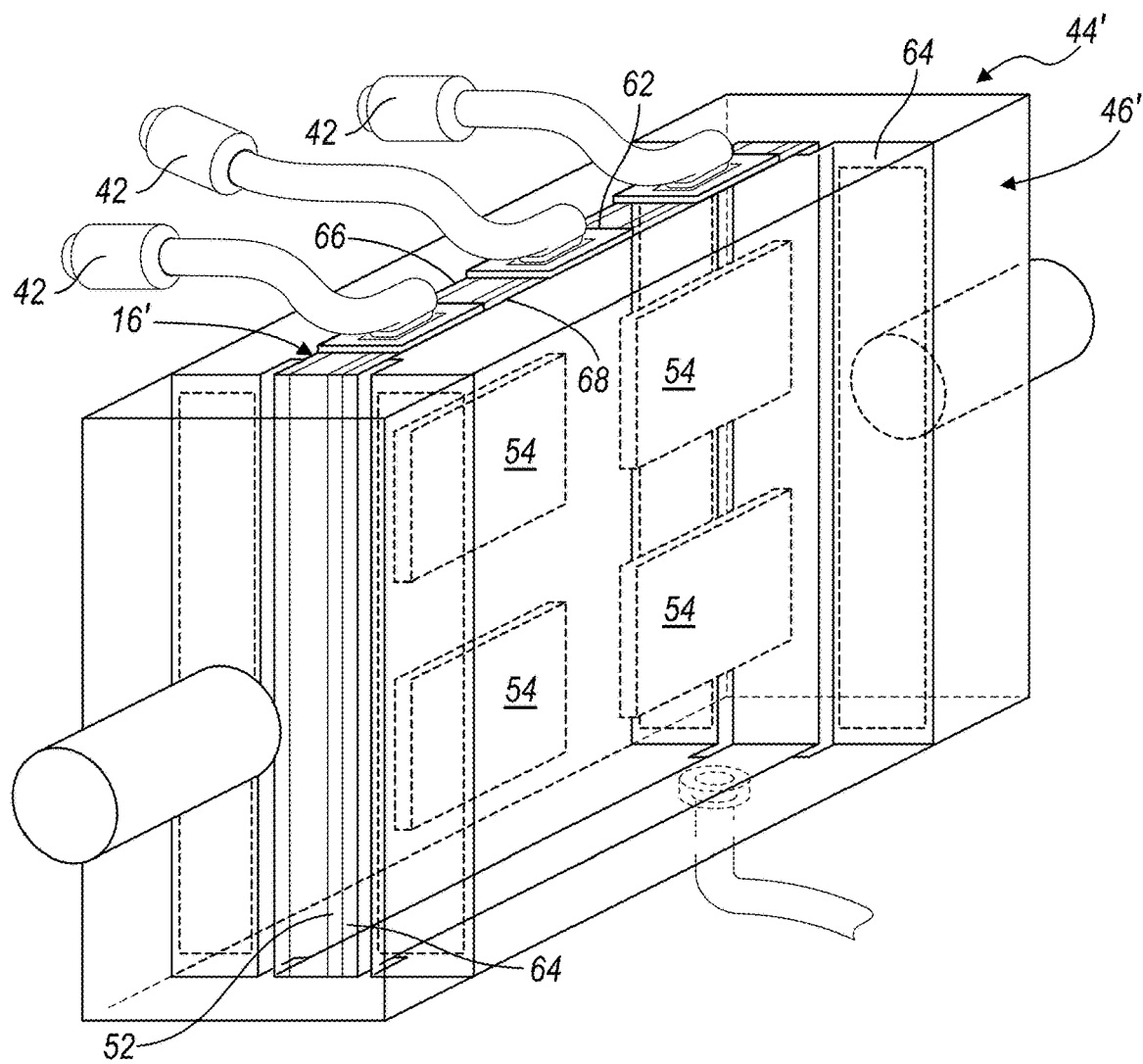
FIG. 5 is a perspective view depicting another implementation of a portion of an electrically-actuated turbocharger assembly.
Figure 6:
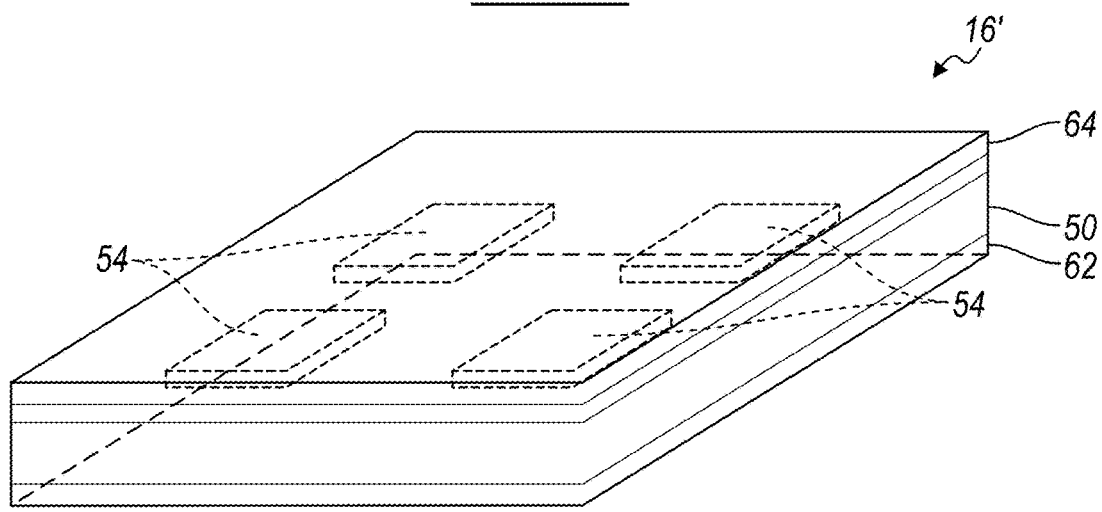
FIG. 6 is a perspective view depicting another implementation of a printed circuit board (PCB) used with the electrically-actuated turbocharger.

Turning to FIG. 5, another implementation of an electronics assembly including a PCB housing 44' and a PCB 16' is shown that can be coupled with the assembly 10. The PCB housing 44' includes a fluid cavity 46' that is partially defined by a first side of the PCB 16' and a second side of the PCB 16'. The PCB 16' can include a first fluid barrier layer 62 on one side of the PCB 16' and a second fluid barrier layer 64 on an opposite side of the PCB 16'. The PCB 16' can include the first fluid barrier layer 62, a conductive layer 50, a substrate layer 52, and the second fluid barrier layer 64. FIG. 6 depicts the PCB 16' in more detail. The first fluid barrier layer 62 can be applied to the conductive layer 50. The substrate layer 52 can be bonded to the conductive layer 50 and carry the electrical components 54 as is described above. The substrate layer 52 can support a plurality of electrical components 54 that form the electrical circuitry used to control and selectively supply power to the electrically-actuated turbocharger 12. The second fluid barrier layer 64 can be applied over the substrate layer 52 and the electrical components 54 mounted on the layer 52. The first fluid barrier layer 62 and the second fluid barrier layer 64 can each comprise acrylated polyurethane as discussed above. The PCB housing 44' can include slots 54 that receive the edges of the PCB 16' to form a fluid tight seal between the first fluid barrier layer 60 and the housing 44' and the second fluid barrier layer 62 and the housing 44'. Additionally, the slots 54 can rigidly hold the PCB 16' in a fixed position within the PCB housing 44'.

The PCB housing 44' receives fluid at an inlet port 58 and communicates the fluid over the PCB 16' to an outlet port 60. The PCB housing 44' can include a first fluid cavity 66 that is at least partially defined by the first fluid barrier layer 66 and a second fluid cavity 68 that is at least partially defined by the second fluid barrier layer 64. As fluid arrives at the inlet port 58, the PCB 16' can divide the flow of fluid between the first fluid cavity 66 and the second fluid cavity 68. The fluid flow can contact the first fluid barrier layer 64 and the second fluid barrier layer 66 as is passes through the first fluid cavity 66 and the second fluid cavity 68 thereby removing heat from the PCB 16'.

It is to be understood that the foregoing is a description of one or more embodiments of the invention. The invention is not limited to the particular embodiment(s) disclosed herein, but rather is defined solely by the claims below. Furthermore, the statements contained in the foregoing description relate to particular embodiments and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art. All such other embodiments, changes, and modifications are intended to come within the scope of the appended claims.

As used in this specification and claims, the terms "e.g.," "for example," "for instance," "such as," and "like," and the verbs "comprising," "having," "including," and their other verb forms, when used in conjunction with a listing of one or more components or other items, are each to be construed as open-ended, meaning that the listing is not to be considered as excluding other, additional components or items. Other terms are to be construed using their broadest reasonable meaning unless they are used in a context that requires a different interpretation.

What is claimed is:

1. A power electronics assembly that controls an electrically-actuated turbocharger, comprising:

a printed circuit board (PCB) including:
- a non-conductive substrate supporting one or more electrical components that attach to the non-conductive substrate on one or more sides of the PCB;
- one or more conductive layers that couple with the non-conductive substrate and conduct electrical current with the PCB;

a fluid barrier layer applied to an outer surface of the non-conductive substrate or conductor layer; and a PCB housing, configured to couple within the electrically-actuated turbocharger, having a fluid cavity that communicates liquid from an internal combustion engine (ICE) to the fluid barrier layer separating the liquid and the PCB.

2. The power electronics assembly recited in claim 1, further comprising a second fluid barrier layer applied to a surface of the PCB opposite of the fluid barrier layer.

3. The power electronics assembly recited in claim 2, further comprising a plurality of electrical components covered by the second fluid barrier layer.

4. The power electronics assembly recited in claim 1, further comprising a second fluid cavity.

5. The power electronics assembly recited in claim 1, further comprising a plurality of electrical components covered by the fluid barrier layer.

6. The power electronics assembly recited in claim 1, wherein the fluid barrier layer comprises an acrylated polyurethane.

7. The power electronics assembly recited in claim 1, further comprising one or more slots in the PCB housing within the fluid cavity that receive the PCB.

8. The power electronics assembly recited in claim 1, further comprising an electrically-actuated turbocharger.

9. The power electronics assembly recited in claim 8, wherein the electrically-actuated turbocharger further comprises a compressor and an exhaust turbine.

10. A power electronics assembly that controls an electrically-actuated turbocharger, comprising:

a printed circuit board (PCB) including:
- a non-conductive substrate supporting one or more electrical components that attach to the non-conductive substrate on one side of the PCB;
- one or more conductive layers that couple with the non-conductive substrate and conduct electrical current within the PCB;

a first fluid barrier layer applied to an outer surface of the non-conductive substrate;

a second fluid barrier layer applied to an outer surface of the conductive layer;

a PCB housing, configured to couple with the electrically-actuated turbocharger, having a first fluid cavity partially defined by the first fluid barrier layer and a second fluid cavity partially defined by the second fluid barrier layer, that communicates liquid from an internal combustion engine (ICE) over the first fluid barrier layer and the second fluid barrier layer separating the liquid and the PCB.

11. The power electronics assembly recited in claim 10, further comprising a plurality of electrical components covered by the first fluid barrier layer or the second fluid barrier layer.

12. The power electronics assembly recited in claim 10, wherein the first fluid barrier layer and the second fluid barrier layer comprise an acrylated polyurethane.

13. The power electronics assembly recited in claim 10, further comprising one or more slots in the PCB housing, in between the first fluid cavity and the second fluid cavity, that receive the PCB.

14. The power electronics assembly recited in claim 10, further comprising an electrically-actuated turbocharger.

15. The power electronics assembly recited in claim 14, wherein the electrically-actuated turbocharger further comprises a compressor and an exhaust turbine.

\* \* \* \* \*